United States Patent
Lee et al.

(10) Patent No.: US 10,406,684 B2
(45) Date of Patent: Sep. 10, 2019

(54) SYSTEM AND METHOD OF CONTROLLING A ROBOT

(71) Applicant: SK hynix Inc., Gyeonggi-do (KR)

(72) Inventors: Sang Tae Lee, Gyeonggi-do (KR); Yun Il Kim, Gyeonggi-do (KR); Dong Ju Seok, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 257 days.

(21) Appl. No.: 14/842,454

(22) Filed: Sep. 1, 2015

(65) Prior Publication Data

US 2016/0318184 A1 Nov. 3, 2016

(30) Foreign Application Priority Data

Apr. 30, 2015 (KR) .................. 10-2015-0061559

(51) Int. Cl.
*B25J 9/16* (2006.01)
*H01L 21/67* (2006.01)
*H01L 21/677* (2006.01)

(52) U.S. Cl.
CPC ........ *B25J 9/162* (2013.01); *H01L 21/67259* (2013.01); *H01L 21/67748* (2013.01); *G05B 2219/45032* (2013.01); *Y10S 901/01* (2013.01); *Y10S 901/02* (2013.01); *Y10S 901/46* (2013.01)

(58) Field of Classification Search
CPC ..... B25J 9/1687; Y10S 901/01; Y10S 901/46; Y10S 901/00
See application file for complete search history.

(56) References Cited

U.S. PATENT DOCUMENTS

| | | | | |
|---|---|---|---|---|
| 3,593,127 A * | 7/1971 | Lucka | ............... | G01B 7/023 324/662 |
| 4,618,014 A * | 10/1986 | Kobayashi | ............... | G01G 3/16 177/185 |
| 4,766,322 A * | 8/1988 | Hashimoto | ............ | B25J 9/1015 250/559.33 |
| 5,063,454 A * | 11/1991 | Hashimoto | .......... | G11B 5/5547 318/561 |
| 5,784,346 A * | 7/1998 | Matsuo | .................. | G11B 19/24 369/47.47 |
| 6,034,834 A * | 3/2000 | Yoshikawa | ............ | G11B 21/02 360/75 |
| 6,160,674 A * | 12/2000 | Yun | .................... | G11B 5/59688 360/60 |
| 6,163,148 A * | 12/2000 | Takada | ..................... | B62M 6/45 180/206.3 |
| 6,286,628 B1 * | 9/2001 | Lee | ........................ | B66B 1/304 187/393 |

(Continued)

FOREIGN PATENT DOCUMENTS

KR 1020130033560 4/2013

*Primary Examiner* — Kenneth M Lo
*Assistant Examiner* — Mohammad A Rahman
(74) *Attorney, Agent, or Firm* — IP & T Group LLP

(57) ABSTRACT

A system for controlling a robot moving vertically and horizontally using a motor is provided. The system includes a detector suitable for generating a feedback signal by detecting physical status of the motor; and a controller suitable for detecting loading of a substrate on the robot based on the feedback signal during a vertical moving interval of the robot, and generating a control command in accordance with the detection of the loading of the substrate.

24 Claims, 6 Drawing Sheets

(56) References Cited

U.S. PATENT DOCUMENTS

| | | | |
|---|---|---|---|
| 6,438,458 B2* | 8/2002 | Shimoike | G05B 19/41815 318/568.21 |
| 6,590,358 B1* | 7/2003 | Tsutsui | G05B 5/01 318/560 |
| 8,597,178 B2* | 12/2013 | Yoshie | A61B 1/00147 600/146 |
| 8,613,303 B1* | 12/2013 | Hanneken | B60C 25/056 157/1.17 |
| 9,573,789 B2* | 2/2017 | Appana | B66B 1/2408 |
| 2005/0230192 A1* | 10/2005 | Brant | B66B 1/40 187/284 |
| 2006/0066111 A1* | 3/2006 | Suryanarayanan | F03D 7/0272 290/44 |
| 2009/0184834 A1* | 7/2009 | Chiu | G05B 19/4062 340/648 |
| 2009/0218175 A1* | 9/2009 | Wesson | B66B 1/308 187/290 |
| 2009/0255765 A1* | 10/2009 | Mishima | B66B 1/30 187/293 |
| 2010/0300815 A1* | 12/2010 | Stolt | B66B 1/3476 187/277 |
| 2011/0056771 A1* | 3/2011 | Ohya | B66B 1/30 187/296 |
| 2012/0224965 A1* | 9/2012 | Behrens | F03D 1/065 416/23 |
| 2013/0343840 A1* | 12/2013 | Fujii | H01L 21/67259 414/217 |
| 2015/0155135 A1* | 6/2015 | Kato | H01J 37/304 250/492.3 |
| 2015/0211501 A1* | 7/2015 | Yamada | E02F 9/2235 417/222.1 |
| 2015/0274485 A1* | 10/2015 | Appana | B66B 1/2408 187/381 |
| 2015/0321880 A1* | 11/2015 | Schonauer | B66B 5/02 187/292 |

* cited by examiner 529-1

529-2

SYSTEM AND METHOD OF CONTROLLING A ROBOT

CROSS-REFERENCES TO RELATED APPLICATION

The present application claims priority under 35 U.S.C. § 119(a) to Korean application number 10-2015-0061559, filed on Apr. 30, 2015, in the Korean Intellectual Property Office, which is incorporated herein by reference in its entirety.

BACKGROUND

1. Technical Field

Various embodiments generally relate to a robot control technology and, more particularly, to a system and a method of controlling a robot, and a computer program for controlling the robot.

2. Related Art

During the semiconductor fabrication process, an electronic circuit is formed through a combination of stacking sequences and pattern shapes of various material layers on a substrate.

Various unit processes including deposition, etching, polishing, cleaning, etc., are repeated during the semiconductor fabrication process. The substrate is loaded into chambers that provide precise ambient conditions for the unit processes.

Thus, semiconductor fabrication equipment includes robots suitable for transferring the substrate among the chambers.

The robot is operated by a motor driven by a drive signal from a driver in response to a control command from a controller. The controller is required to accurately and precisely operate the robot.

SUMMARY

According to an embodiment, there is provided a system for controlling a robot moving vertically and horizontally using a motor, the system comprising: a detector suitable for generating a feedback signal by detecting physical status of the motor; and a controller suitable for detecting loading of a substrate on the robot based on the feedback signal during a vertical moving interval of the robot, and generating a control command in accordance with the detection of the loading of the substrate.

According to an embodiment, there is provided a method of controlling a robot moving vertically and horizontally using a motor, the method comprising: receiving a feedback signal representing physical status of the motor; generating a substrate detection signal by detecting loading of a substrate on the robot based on the feedback signal during a vertical moving interval of the robot; and generating a control command based on the substrate detection signal.

BRIEF DESCRIPTION OF THE DRAWINGS

The embodiments can be understood in more detail from the following detailed description taken in conjunction with the accompanying drawings. FIGS. 1 to 8 represent non-limiting embodiments as described herein.

FIG. 1 is a block diagram illustrating a system for controlling a robot in accordance an embodiments;

FIG. 2 is a block diagram illustrating a controller of the system in FIG. 1;

FIG. 3 is a block diagram illustrating a substrate-detecting unit of the controller in FIG. 2;

FIG. 4 is a block diagram illustrating a robot-controlling unit of the controller in FIG. 2;

FIG. 5 is a timing chart illustrating a method of controlling a robot in accordance an embodiment;

FIG. 6 is a flow chart illustrating a method of controlling a robot in accordance with an embodiment;

FIG. 7 is a cross-sectional view illustrating semiconductor fabrication equipment in accordance an embodiment.

DETAILED DESCRIPTION

Figure 1:
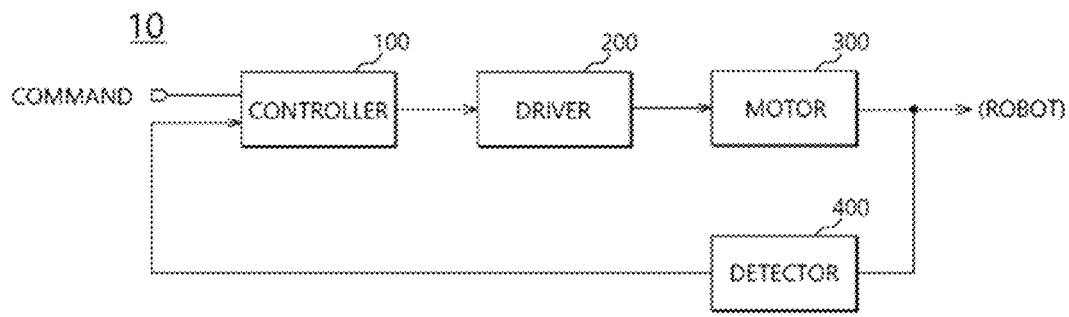

Various embodiments will be described more fully hereinafter with reference to the accompanying drawings. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc may be used herein to describe various elements, components, regions, layers and/or sections, these elements, components, regions, layers and/or sections should not be limited by these terms. These terms are only used to distinguish one element, component, region, layer or section from another region, layer or section. Thus, a first element component, region, layer or section discussed below could be termed a second element, component, region, layer or section without departing from the teachings of the present invention.

Spatially relative terms, such as "beneath," "below," "lower," "above," "upper" and the like, may be used to make it easier to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used is not intended to limit the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Idealized embodiments are described herein with reference to cross-sectional illustrations (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all ter (including technical and scientific terms) used herein have the same meaning as commonly understood by one of ordinary skill in the art to which this invention belongs. It will be further understood that terms, such as those defined in commonly used dictionaries, should be interpreted as having meaning that is consistent with their meaning in the context of the relevant art and will not be interpreted in an idealized or overly formal sense unless expressly so defined herein.

Hereinafter, embodiments will be explained in detail with reference to the accompanying drawings.

FIG. 1 is a block diagram illustrating a system 10 for controlling a robot in accordance with an embodiment.

Referring to FIG. 1, the system 10 may include a controller 100, a driver 200, a motor 300 and a detector 400.

The controller 100 may control all operations of the system 10. The controller 100 may control vertical and horizontal movements of the robot to locate the robot at a target position. In an embodiment, the controller 100 may generate control commands for operating the robot in response to a command signal from an external device and a feedback signal from the detector 400. The controller 100 may transmit the control commands to the driver 200. The control commands may include a position command, a velocity command, a current command, a torque command, etc.

The controller 100 may determine whether a substrate is loaded on a blade of the robot during a vertical moving interval of the robot in response to a motor detection signal, which is one of the feedback signals from the detector 400. The controller 100 may control the robot in accordance with the loading of the substrate on the robot. The motor detection signal may include a position signal. For example, the position signal may represent the position of the motor 300.

The driver 200 may generate and transmit a drive signal to the motor 300 in response to the control commands from the controller 100. The motor 300 may operate the robot to have a desired position, direction, speed, torque, etc. in response to the drive signal. In an embodiment, the motor 300 may move the robot to the desired position in the desired direction. For example, the motor 300 may move the robot in the vertical and horizontal directions.

The detector 400 may be disposed at a driving shaft of the motor 300. The detector 400 may detect the physical status of the motor 300, for example, a rotation angle of the motor 300. The detector 400 may transmit the rotation angle as the position signal or the motor detection signal to the controller 100. In an embodiment, the detector 400 may include an encoder, tachometer, etc.

In example embodiments, the robot may be moved by the motor 300 to the desired position in the desired direction. For example, the robot may be moved in the vertical and horizontal directions.

In the system 10, the controller 100 may generate the control commands in accordance with a difference between the command signal and the feedback signal. Further, the driver 200 may perform a power conversion in accordance with the control commands to provide the drive signal to the motor 300.

The controller 100 may detect a vertical speed of the motor 300 from the feedback signal of the detector 400. The feedback signal of the detector 400 may include the position signal of the motor 300. Because a differential value of the position signal corresponds to a speed, the controller 100 may detect the speed of the motor 300 from the position signal.

The motor 300 may have a speed profile comprising first to third speed intervals. During the first speed interval, the motor 300 accelerate and decelerate the robot to a first location. During the second speed interval, the motor 300 may move the robot to a second location with a constant speed after the substrate is loaded on the robot. During the third speed interval, the motor 300 may accelerate and decelerate the robot to a third location or a target location.

During the second speed interval of the constant speed, when the substrate is loaded on the blade of the robot, the blade may quiver due to the weight of the substrate. The quiver of the blade may cause changes in the position signal of the motor 300 suitable for vertically moving the robot.

In accordance with an embodiment of the present invention, the second speed interval of the motor 300 may be detected based on the feedback signal, i.e., the position signal from the detector 400. During the second speed interval, the feedback signal or the position signal from the detector 400 may be compared with the command signal. When there is a change in the position signal of the motor 300, i.e., a position error of the motor 300 during the second speed interval of the constant speed, the loading of the substrate on the blade may be detected. In order to improve accuracy of the detection, the loading of the substrate on the blade may be preferably detected when the position error lasts for a predetermined time during the second speed interval.

During the vertical moving interval of the motor 300, the drive signal for controlling the motor 300, for example, a current value may be determined in accordance with whether the substrate is loaded on the blade. To this end, the type of substrate on the blade may be identified based on change of the current value detected when the substrate is loaded onto the blade, and the drive signal for controlling the motor 300 may be determined on the basis of the identified type of the substrate.

In an embodiment, the current value change when the substrate is loaded on the blade may be obtained through secondary differentiation of the position signal from the detector 400. However, it is obvious that the current value change can be obtained through various manners other than secondary differentiation.

Figure 2:
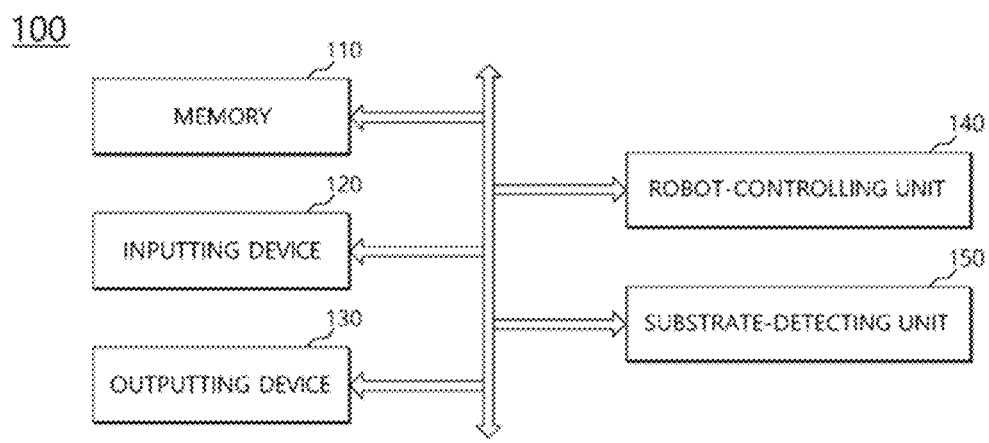

FIG. 2 is a block diagram illustrating the controller 100 of the system 10 in FIG. 1.

Referring to FIG. 2, the controller 100 may include a memory 110, an inputting device 120, an outputting device, a robot-controlling unit 140 and a substrate-detecting unit 150.

The memory 110 may include a main memory unit and an auxiliary memory unit. The memory 110 may store data for operation of the system 10.

The inputting device 120 may include an interface suitable for receiving operational parameters, control commands, etc., including the command signal for controlling the system 10.

The outputting device 130 may include an interface suitable for outputting signals with respect to operations of the system 10.

Data may be transmitted through an external computing device networked with the controller 100. The computing device may be coupled to the controller 100 through wire or wireless data communication links.

The robot-controlling unit 140 may generate the control commands for controlling the robot based on the feedback signal from the detector 400 and the command signal from the inputting device 120. Particularly, the robot-controlling unit 140 may generate the control commands in accordance with the difference between the command signal and the feedback signal. The control commands may include the position command, the speed command, the current command, the torque command, etc.

The substrate-detecting unit 150 may detect the loading of the substrate on the blade of the robot based on the feedback signal from the detector 400.

In an embodiment, the substrate-detecting unit 150 may detect the speed of the motor 300 based on the feedback signal or the position signal from the detector 400. When a position error occurs during the second speed interval of the motor 300 and particularly the position error lasts for the predetermined unit time, the substrate-detecting unit 150 may detect the loading of the substrate on the blade of the robot. When the substrate is loaded on the blade of the robot, the substrate-detecting unit 150 may transmit a substrate detection signal to the robot-controlling unit 140. The substrate-detecting unit 150 may detect the loading of the substrate during the vertical moving interval of the robot.

Therefore, the robot-controlling unit 140 may generate the control commands for the robot according to the loading or the unloading of the substrate on the blade of the robot.

Figure 3:
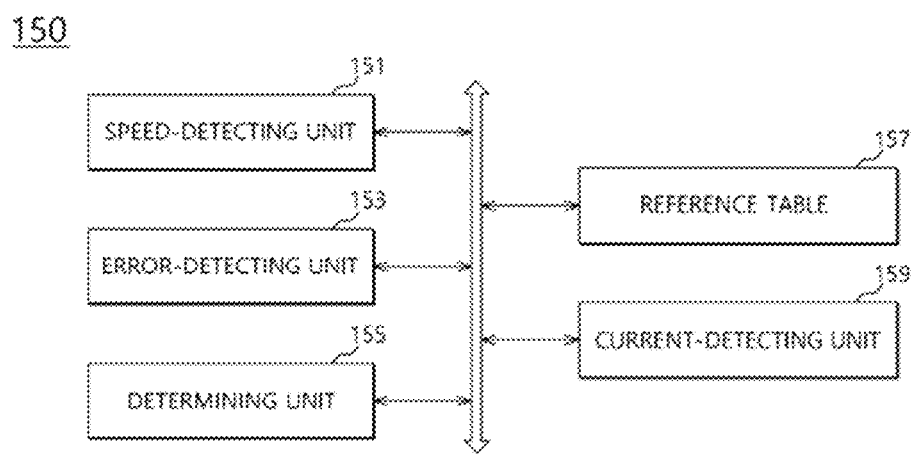

FIG. 3 is a block diagram illustrating the substrate-detecting unit 150 of the controller 100 in FIG. 2.

Referring to FIG. 3, the substrate-detecting unit 150 may include a speed-detecting unit 151, an error-detecting unit 153 and a determining unit 155.

The speed-detecting unit 151 may detect the speed of the motor 300 based on the feedback signal or the position signal from the detector 400. The speed-detecting unit 151 may detect the speed of the motor 300 by primarily differentiating the feedback signal. Therefore, the speed-detecting unit 151 may detect the second speed interval of the constant speed of the motor 300.

The error-detecting unit 153 may detect the position error of the motor 300 based on the feedback signal from the detector 400 and the command signal during the second speed interval of the constant speed of the motor 300.

The determining unit 155 may determine the loading of the substrate on the blade of the robot during the second speed interval of the constant speed based on the detection results of the speed-detecting unit 151 and the error-detecting unit 153. The determining unit 155 may generate and transmit a substrate detection signal to the robot-controlling unit 140 when the position error of the motor 300 occurs during the second speed interval of the constant speed of the motor 300.

In an embodiment, the determining unit 155 may generate and transmit the substrate detection signal to the robot-controlling unit 140 when the position error of the motor 300 lasts for the predetermined time during the second speed interval of the constant speed of the motor 300.

The substrate-detecting unit 150 may further include a reference table 157 and a current-detecting unit 159.

The reference table 157 may store impact forces and torque correction values of various types of the substrates that the robot may transfer. The impact forces may correspond to current values applied to the blade of the robot at the loading of the substrate on the blade. In an embodiment, examples of the various types of the substrates may include wafers having a diameter of about 200 mm, about 300 mm, about 450 mm, etc. The size of the substrate may determine the weight of the substrate. The controller 100 may determine the drive signal for the motor 300 in accordance with the size or the weight of the substrate loaded on the blade of the robot.

The current-detecting unit 159 may detect an actual current value of the motor 300 at the loading of the substrate on the blade determined by the determining unit 155. The current-detecting unit 159 may select the torque correction value corresponding to the impact force of the detected actual current value from the reference table 157. The current-detecting unit 159 may transmit the selected torque correction value to the robot-controlling unit 140. The robot-controlling unit 140 may reflect the selected torque correction value to a torque of the motor 300.

Thus, the controller 100 may control the motor 300 by providing optimal force to the motor 300 through the driver 200 for various types of the substrates transferred by the robot.

In an embodiment, the current-detecting unit 159 may receive the speed of the motor 300, which is the primarily differentiated value of the feedback signal or the position signal provided from the detector 400, from the speed-detecting unit 151. The current-detecting unit 159 may secondarily differentiate the primarily differentiated value to obtain the actual current of the motor 300. The current-detecting unit 159 may detect the actual current value of the motor 300 based on an acceleration value corresponding to the secondary differentiation value of the feedback signal.

The current-detecting unit 159 may generate a vibration control signal based on the detected actual current value. For example, in order to generate the vibration control signal, the current-detecting unit 159 may measure a vibration frequency based on a difference between a command current value and the actual current value. The current-detecting unit 159 may transmit the vibration frequency to the robot-controlling unit 140.

Figure 4:
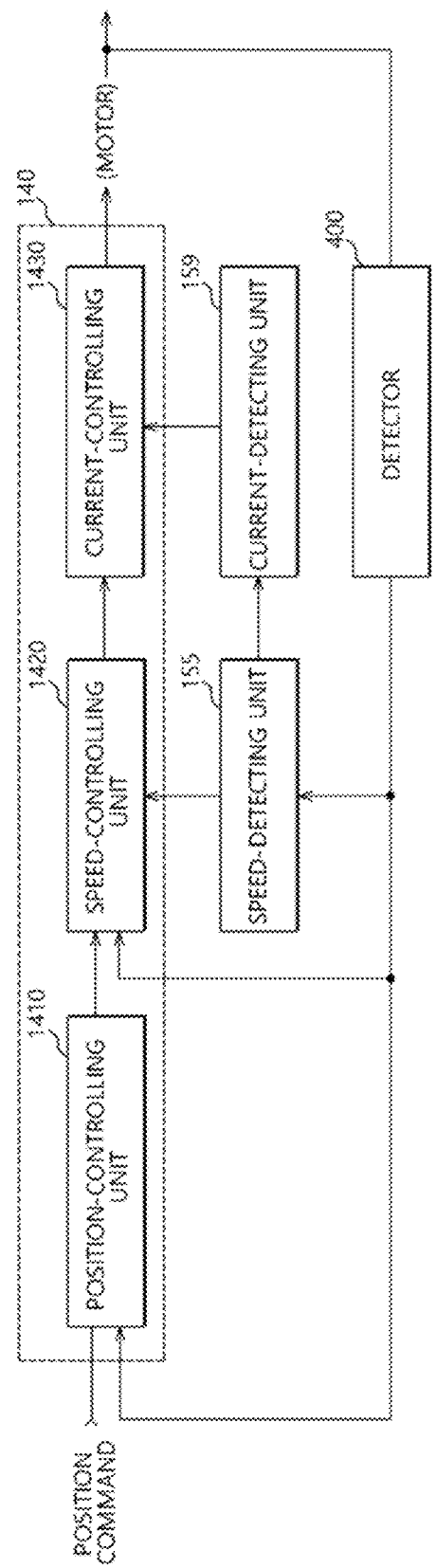

FIG. 4 is a block diagram illustrating the robot-controlling unit 140 of the controller in FIG. 2.

Referring to FIG. 4, the robot-controlling unit 140 may include a position-controlling unit 1410, a speed-controlling unit 1420 and a current-controlling unit 1430.

The position-controlling unit 1410 may generate a position control command based on the difference between the command signal, i.e., a position command signal from the inputting device 120, and the feedback signal or the position signal from the detector 400.

The speed-controlling unit 1420 may receive the position control command as a speed command signal. The speed-controlling unit 1420 may detect the difference between the feedback signal from the detector 400 and the speed command signal. The speed-controlling unit 1420 may generate a speed control command based on the substrate detection signal from the determining unit 155 during the vertical moving interval of the motor 300.

In an embodiment, the current-detecting unit 159 may measure the vibration frequency based on the difference between the command current value and the actual current value to generate the vibration control signal. The current-controlling unit 1430 may generate a current control command based on the vibration control signal from the current-detecting unit 159.

The current-controlling unit 1430 may receive the speed control command as a current command signal. The current-controlling unit 1430 may correct the current control command based on the torque correction value from the current-detecting unit 159. As mentioned above, the current-detecting unit 159 may detect the actual current value during the vertical moving interval of the motor 300. The torque correction value corresponding to the actual current value may be obtained from the reference table 157.

In an embodiment, the loading of the substrate on the blade of the robot may be detected on the basis of the feedback signal from the detector 400. The types of the substrate on the blade may also be identified based on the feedback signal from the detector 400.

Therefore, various shapes and sizes of the blades may be applied to the robot without an additional apparatus for detecting the loading of the substrate on the blade.

Figure 5:
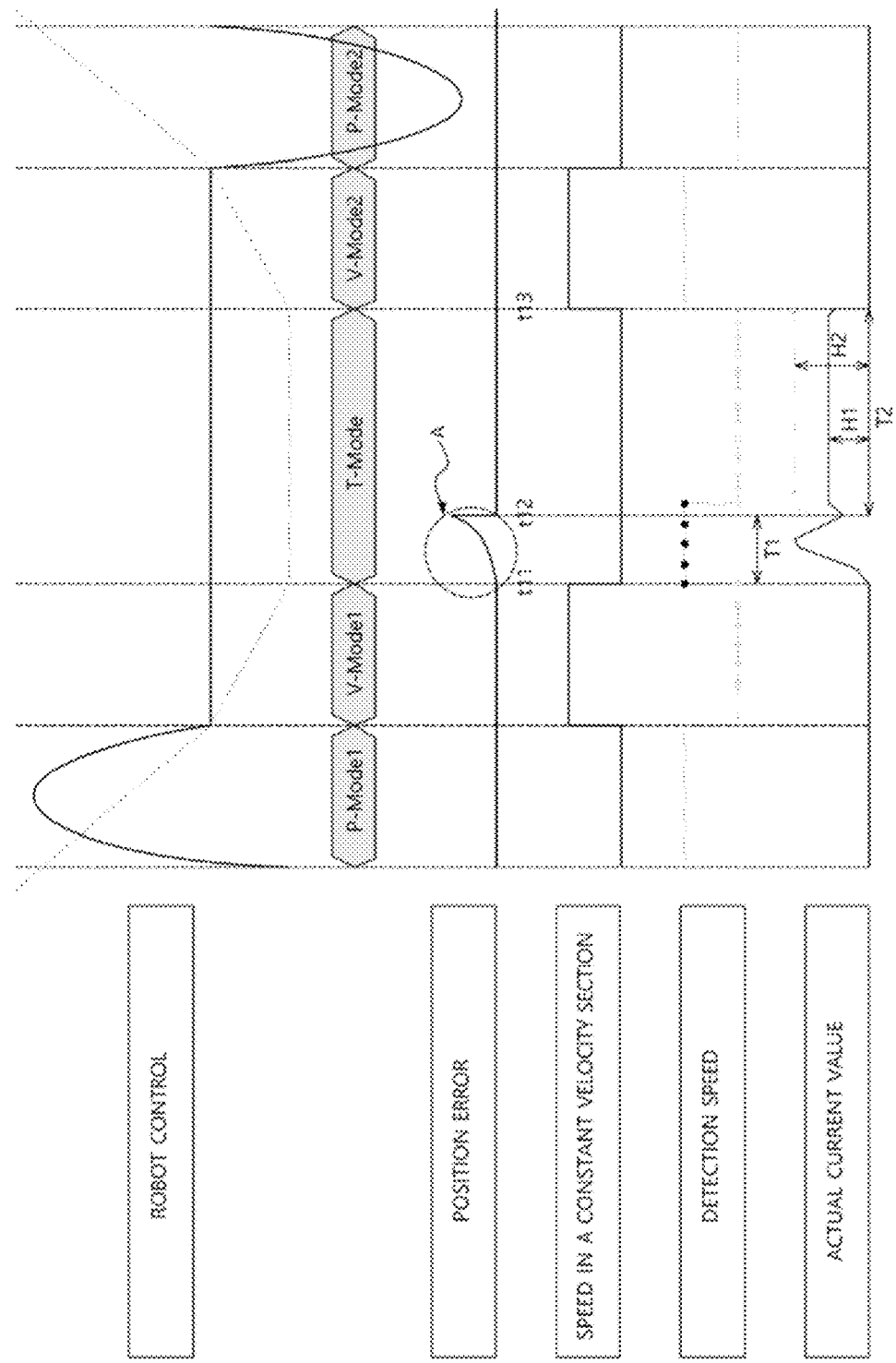
Figure 6:
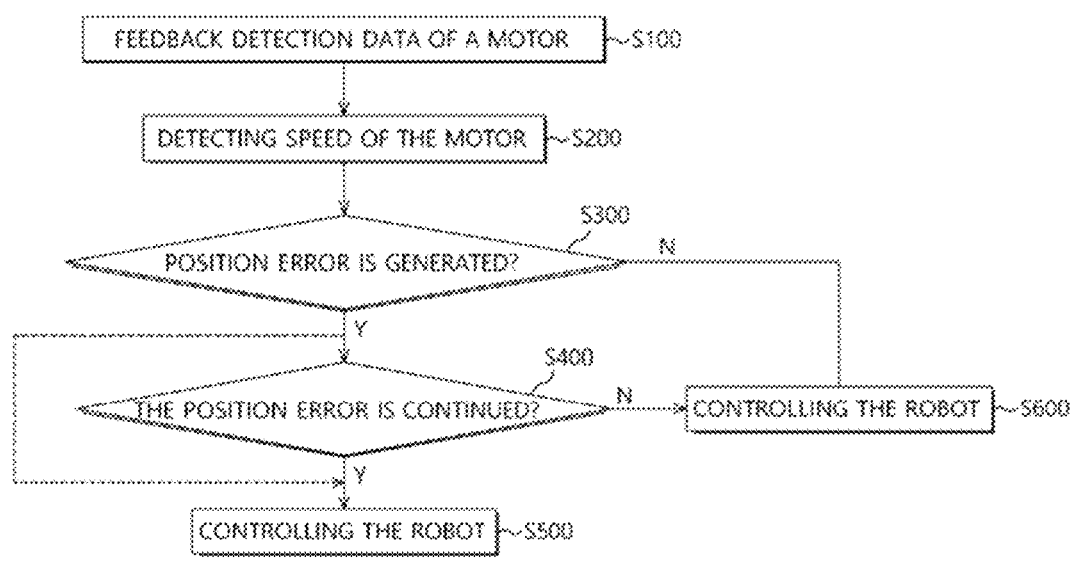

FIG. 5 is a timing chart illustrating a method of controlling the robot in accordance with an embodiment and FIG. 6 is a flow chart illustrating the method of controlling the robot in accordance with an embodiment.

Referring to FIG. 5, the motor 300 may be vertically moved according to the speed profile having the first to third speed intervals. FIG. 5 shows the first speed interval as a first position control mode P-Mode1, shows the second speed interval as a first speed control mode V-Mode1, a torque control mode T-Mode and a second speed control mode V-Mode2, and shows the third speed interval as a second position control mode P-Mode 2.

The motor 300 may be driven by the drive signal of the driver 200 under the control of the controller 100 to operate the robot. The detector 400 may continuously receive the position signals from the motor 300. The detector 400 may transmit the feedback signal to the controller 100.

During the first position control mode P-Mode 1 or the first speed interval of the motor 300, the robot may vertically move to the first location.

After the robot is positioned at the first location, the robot may move with constant speed during the second speed interval. At step S100, the controller 100 may continuously receive the feedback signal or the position signal from the detector 400. At step S200, the controller 100 may primarily differentiate the feedback signal to detect the speed of the motor 300.

At step S300 during the second speed interval of the constant speed of the motor 300, when a position error A occurs at a specific time t11, which is identified from the comparison between the feedback signal from the detector 400 and the command signal from the inputting device, the controller 100 may determine the loading of the substrate on the robot. At step S500, the controller 100 may enter the torque control mode T-Mode in the second speed interval to generate the current control command.

As another embodiment (not illustrated in FIG. 5), at step S400, when the position error A lasts for the predetermined time T1 ending at the time t12, the controller 100 may determine the loading of the substrate on the robot and perform step S500. For example, the motor 300 may drive the robot in response to the current control command during an interval T2, which is the rest interval of the torque control mode T-Mode after the detection of the loading of the substrate at the time t12. When the controller 100 enters the second speed control mode V-Mode2 in the second speed interval, the robot may move to a second location. During the second position control mode P-Mode2 or the third speed interval, the robot may move to a third location.

When the actual current value of the motor 300 is detected by the current-detecting unit 159 at the loading of the substrate on the blade during the unit time T1, types of the substrate may be identified through the detected actual current value and the reference table 157 storing the impact forces and torque correction values of various types of the substrates that the robot may transfer.

Further, the current control command during the torque control mode T-Mode may be corrected in accordance with the identified type of the substrate. For example, the current control command may be changed between H1 and H2 (shown in FIG. 5) based on the torque correction value from the current-detecting unit 159 in accordance with the identified type of substrate. As described above, the current-detecting unit 159 may measure the vibration frequency based on the difference between the command current value and the actual current value to generate the vibration control signal. The current-controlling unit 1430 may generate the current control command based on the vibration control signal from the current-detecting unit 159. The current-controlling unit 1430 may correct the current control command based on the torque correction value from the current-detecting unit 159.

The current control command corrected by the torque correction value may be applied to the motor 300 during the interval T2, which is the rest interval of the torque control mode T-Mode after the detection of the loading of the substrate at the time t12.

Referring to FIG. 6, at step S600, when the substrate is not loaded on the robot during the second speed interval of the motor 300, the current control command for driving the robot without the substrate may be generated.

In the robot control system 10, the functions of the controller 100 may be performed by computer programs applicable for the robot control system 10.

Figure 7:
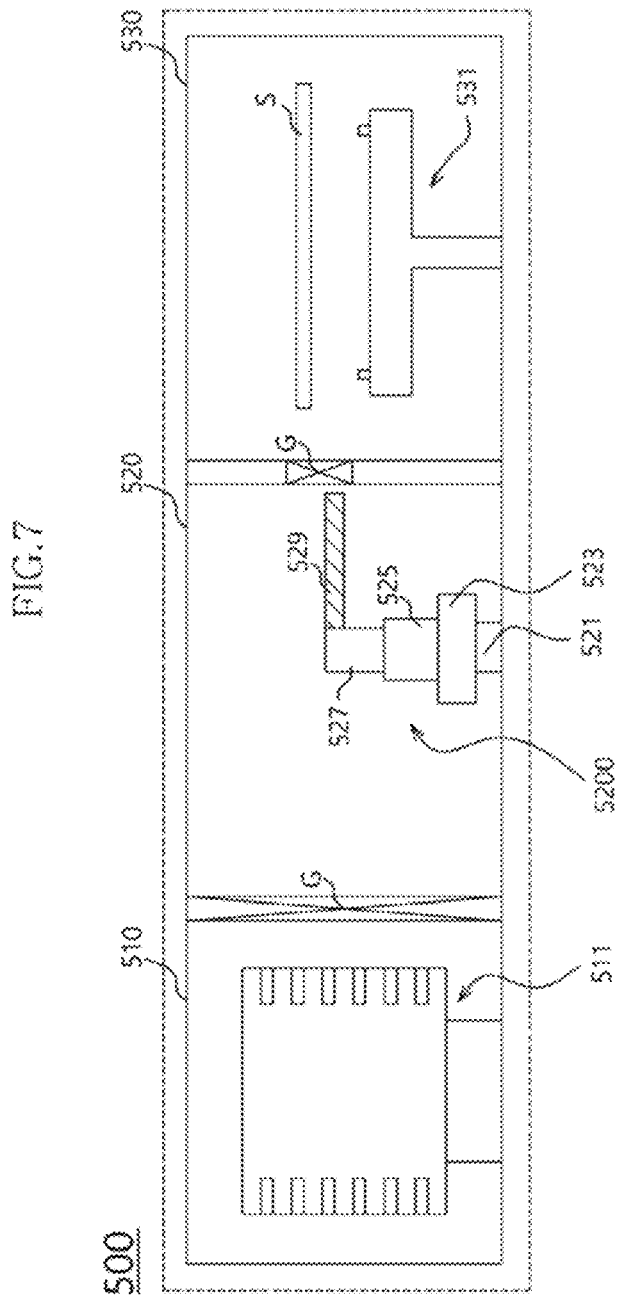

FIG. 7 is a cross-sectional view illustrating semiconductor fabrication equipment in accordance with an embodiment.

Referring to FIG. 7, the semiconductor fabrication equipment 500 may include at least one buffer chamber 510, transfer chamber 520 and a plurality of process chambers 530.

The buffer chamber 510 may include a cassette 511 suitable for receiving the substrate before or after a process. The cassette 511 may include a front opening unified pod (FOUP).

A robot 5200 may be arranged in the transfer chamber 520. The robot 5200 may include a body 521, a first moving member 523, a second moving member 525, a rotary actuator 527 and a blade 529.

The first moving member 523 may be combined with the body 521 in the horizontal direction. The second moving member 525 may be combined with the body 521 in the vertical direction. The rotary actuator 527 may be installed at the body 521 to rotate the blade 529 in the horizontal direction.

Figure 8A:
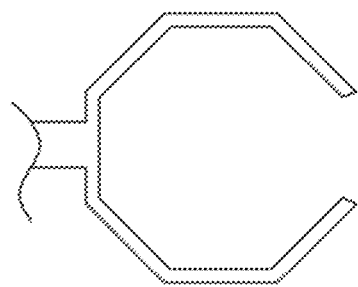
FIGS. 8A and 8B are cross-sectional views illustrating blades in accordance with an embodiment.
Figure 8B:
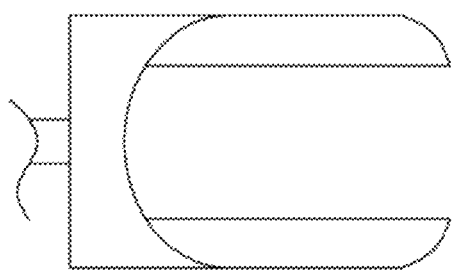

The blade 529 may be suitable for receiving the substrate S. Referring to FIGS. 8A and 8B, the blade 529 may have various shapes. In FIG. 8A, the blade 529-1 may have a circular shape. In FIG. 8B, the blade 529-1 may have a quadrilateral shape.

A stage 531 suitable for receiving the substrate S may be arranged in each of the process chambers 530. When the substrate S transferred from the transfer chamber 520 is placed on the stage 531 in the process chamber 530, a process may be performed on the substrate in the process chamber 530.

Gates G may be arranged between the buffer chamber 510 and the transfer chamber 520, and between the transfer chamber 520 and the process chamber 530. The substrate S may pass through the gates S. The gates G may be opened only while the substrate S is transferred. In contrast, the gates G may be closed whenever substrate S is not being transferred to prevent the chambers 510, 520 and 530 from being contaminated.

In an embodiment, the substrate S may include a semiconductor substrate, a flat panel for a liquid display device, a reticle, etc.

Further, the semiconductor fabrication equipment may be In-line type equipment, cluster type equipment, etc.

The semiconductor fabrication equipment 500 may be controlled by the robot control system 10 illustrated with reference to FIGS. 1 to 6.

While various embodiments have been described above, will be understood to those skilled in the art that the embodiments described are examples only. Accordingly, the circuit and method described herein should not be limited based on the described embodiments.

What is claimed is:

1. A system for controlling a robot moving vertically and horizontally using a motor, the system comprising:
    a controller for generating a control command;
    a driver for driving the motor to move the robot comprising a blade, in response to the control command; and
    a detector suitable for generating a feedback signal by detecting physical status of the motor;
    wherein the robot is configured to accelerate and decelerate to a first location during a first speed interval, move to a second location with a constant speed during a second speed interval, and accelerate and decelerate to a target location during a third speed interval,
    wherein the first speed interval, the second speed interval, and the third speed interval occur in sequence,
    wherein the controller is configured to detect whether or not a substrate is loading on the robot based on the feedback signal during the second speed interval beginning at a first time and ending at a second time, and generate the control command in accordance with the detection of the loading of the substrate during the second speed interval at the second time, and
    wherein the controller is configured to detect whether or not a substrate is loading on the robot based on change of the feedback signal according to quiver of the blade due to one of a weight, a size of the substrate when the substrate is loaded on the blade of the robot.

2. The system of claim 1, wherein the controller comprises:
    a substrate-detecting unit suitable for generating a substrate detection signal based on speed and position error of the motor, wherein the speed of the motor is detected from the feedback signal; and
    a robot-controlling unit suitable for generating the control command based on the substrate detection signal and a difference between the feedback signal and a command signal.

3. The system of claim 2, wherein the substrate-detecting unit is suitable for generating the substrate detection signal during the second speed interval when the motor moves the robot with a constant speed.

4. The system of claim 2, wherein the substrate-detecting unit generates the substrate detection signal when the position error lasts for a predetermined unit time during the second speed interval when the motor moves the robot with a constant speed.

5. The system of claim 1, wherein the controller detects an actual current value of the motor based on the feedback signal in accordance with the detection of the loading of the substrate.

6. The system of claim 5,
    wherein the controller includes a reference table suitable for storing impact forces for various types of the substrate and torque correction values corresponding to the impact forces and,
    wherein the controller generates the control command by selecting one of the torque correction values corresponding to one of the impact forces of the detected actual current value.

7. The system of claim 5, wherein the controller detects the actual current value by secondarily differentiating the feedback signal.

8. The system of claim 5, wherein the controller generates the control command by measuring a vibration frequency based on a difference between the actual current value and a command current value.

9. The system of claim 1,
    wherein the controller comprises a substrate-detecting unit, and
    wherein the substrate-detecting unit comprises:
    a speed-detecting unit suitable for detecting a speed of the motor based on the feedback signal;
    an error-detecting unit suitable for detecting a position error of the motor based on the feedback signal; and
    a determining unit suitable for generating a substrate detection signal based on detection results of the speed-detecting unit and the error-detecting unit during the second speed interval when the motor moves the robot with a constant speed.

10. The system of claim 9,
    wherein the feedback signal comprises a position signal of the motor, and
    wherein the speed-detecting unit detects the speed of the motor by differentiating the position signal.

11. The system of claim 9, wherein the determining unit generates the substrate detection signal when the position error lasts for a predetermined unit time during the second speed interval when the motor moves the robot with a constant speed.

12. The system of claim 9, wherein the substrate-detecting unit further comprises:
    a current-detecting unit suitable for detecting an actual current value of the motor based on the feedback signal when the loading of the substrate on the robot is detected; and a reference table for storing impact forces for various types of substrates and torque correction values corresponding to the impact forces, wherein the controller generates the control command by selecting one of the torque correction values corresponding to one of the impact forces of the detected actual current value.

13. The system of claim 12, wherein the controller detects the actual current value by secondarily differentiating the feedback signal.

14. The system of claim 12, wherein the controller generates the control command by measuring a vibration frequency based on difference between the actual current value and a command current value.

15. The system of claim 1, wherein the detector comprises an encoder or a tachometer.

16. A method of controlling a robot moving vertically and horizontally using a motor comprising a blade, in response to a control command generated by a controller, the method comprising:

moving the robot to a first location by acceleration and deceleration during a first speed interval, moving the robot to a second location with a constant speed during a second speed interval, and moving the robot to a target location by acceleration and deceleration during a third speed interval;

receiving a feedback signal representing physical status of the motor;

generating a substrate detection signal by detecting whether or not a substrate is loading on the robot based on the feedback signal during the second speed interval of the robot beginning at a first time and ending at a second time; and generating a control command based on the substrate detection signal during the second speed interval at the second time, wherein the first speed interval, the second speed interval, and the third speed interval occur in sequence, and wherein the controller is configured to detect whether or not a substrate is loading on the robot based on change of the feedback signal according to quiver of the blade due to one of a weight, a size of the substrate when the substrate is loaded on the blade of the robot.

17. The method of claim 16, wherein the generating of the substrate detection signal comprises:

detecting a speed of the motor from the feedback signal; and detecting a position error of the motor from the feedback signal.

18. The method of claim 17, wherein the generating of the substrate detection signal is performed when the position error occurs during the second speed interval when the motor moves the robot with a constant speed.

19. The method of claim 17, wherein the generating of the substrate detection signal is performed when the position error lasts for a predetermined time during the second speed interval when the motor moves the robot with a constant speed.

20. The method of claim 17, wherein the detecting of the speed of the motor is performed by differentiating the feedback signal.

21. The method of claim 16, further comprising detecting an actual current value of the motor based on the feedback signal after the generating of the substrate detection signal.

22. The method of claim 21, wherein the generating of the control command is performed by selecting one of torque correction values corresponding to an impact force of the actual current value among impact forces for various types of the substrate to generate the control command.

23. The method of claim 21, wherein the generating of the control command is performed by measuring a vibration frequency based on difference between the detected actual current value and a command current value.

24. The method of claim 21, wherein the detecting of the actual current value is performed by secondarily differentiating the feedback signal.

* * * * *